(12) United States Patent
Zhai et al.

(10) Patent No.: US 10,114,053 B2
(45) Date of Patent: Oct. 30, 2018

(54) PULSE FREQUENCY MEASUREMENT DEVICE AND METHOD AND CONTROL SYSTEM

(71) Applicant: ABB Schweiz AG, Baden (CH)

(72) Inventors: Lilei Zhai, Zhejiang (CN); Wei Liu, Zhejiang (CN); Axel Lohbeck, Zhejiang (CN)

(73) Assignee: ABB Schweiz AG, Baden (CH)

( * ) Notice: Subject to any disclaimer, the term of this patent is extended or adjusted under 35 U.S.C. 154(b) by 606 days.

(21) Appl. No.: 14/386,374

(22) PCT Filed: Oct. 24, 2012

(86) PCT No.: PCT/CN2012/083428
§ 371 (c)(1),
(2) Date: Sep. 19, 2014

(87) PCT Pub. No.: WO2014/063316
PCT Pub. Date: May 1, 2014

(65) Prior Publication Data
US 2015/0051858 A1  Feb. 19, 2015

(51) Int. Cl.
*G01R 23/10* (2006.01)
*H03K 21/38* (2006.01)

(52) U.S. Cl.
CPC ............ *G01R 23/10* (2013.01); *H03K 21/38* (2013.01)

(58) Field of Classification Search
CPC ........ H03K 21/38; G01H 13/00; G01R 23/10; G01R 23/14
See application file for complete search history.

(56) References Cited

U.S. PATENT DOCUMENTS 4,587,482 A   5/1986  Hasegawa
4,603,292 A   7/1986  Russell
(Continued)

FOREIGN PATENT DOCUMENTS

CN   101221200 A   7/2008
EP      2172785     4/2010

OTHER PUBLICATIONS

First Chinese Patent Office Action dated Dec. 4, 2015 Re ABB Application Serial No. 201280069759.4 (English translation re examiner rejection attached).
(Continued)

*Primary Examiner* — Anh T. N. Vo
(74) *Attorney, Agent, or Firm* — Taft Stettinius & Hollister LLP (57) ABSTRACT

The present invention discloses a pulse frequency measurement device and method and a control system, the device including: a hardware counter configured to perform a counting operation on an input pulse sequence to output a counting result; and a processing unit configured to obtain number of pulses from the counting result outputted by the hardware counter and measure a first time period during which the obtained number of pulses occupy, in which the processing unit includes a frequency calculation module configured to calculate a frequency of the input pulse sequence based on the obtained number of pulses and the first time period. According to the invention, it is possible to achieve adaptive pulse frequency measurement and multi-channel sampling for multiple input pulse sequences with a relatively low cost while ensuring the accuracy of the measurement result.

22 Claims, 5 Drawing Sheets

(56) References Cited

U.S. PATENT DOCUMENTS

| | | | |
|---|---|---|---|
| 5,198,750 A | 3/1993 | Prokin | |
| 6,597,205 B2 * | 7/2003 | Powell | G01R 23/10 327/48 |
| 2003/0117181 A1 | 6/2003 | Powell et al. | |

OTHER PUBLICATIONS

ISA/CN International Search Report dated Aug. 1, 2013 re PCT Application No. PCT/CN2012/083428, filed Oct. 24, 2012.
Supplementary European Search Report, for EP12887133 completed Jan. 7, 2016. 8 pages.
Siwiak, Kazimierz, High Accuracy Fast Frequency Counter, Motorola Inc. Technical Developments vol. 16, Aug. 1992, 2 pages.
Indian Examination Report, Indian Patent Application No. 6878/CHENP/2014, dated Jul. 24, 2018, 6 pages.

\* cited by examiner

PULSE FREQUENCY MEASUREMENT DEVICE AND METHOD AND CONTROL SYSTEM

RELATED APPLICATION

This application is a national filing of PCT application Serial No. PCT/CN2012/083428, filed Oct. 24, 2012.

FIELD OF THE INVENTION

The present invention relates to the field of pulse frequency measurement, and more particularly, to a pulse frequency measurement device and method which are capable of implementing measurement for high frequency pulse sequence using a cheap hardware counter and a low speed processing unit, as well as a control system including the pulse frequency measurement device and a control system configured to perform the pulse frequency measurement method.

BACKGROUND OF THE INVENTION

Nowadays, pulse frequency measurement is widely used in process automation industry and has to deal with pulse sequences with a wide variety of frequencies. The existing implementations usually use FPGAs (Field Programmable Gate Array) to implement a frequency measurement logical function, which increases the cost of implementation. Further, current algorithms for frequency measurement, such as an "f" method which counts the number of pulses in a certain time period and a "t" method which measures a pulse width, require high speed MCUs for high frequency pulses, which also increases the cost.

SUMMARY OF THE INVENTION

The brief summary of the invention will be given below to provide basic understanding of some aspects of the invention. However, it shall be appreciated that this summary is neither exhaustively descriptive of the invention nor intended to define essential or important components or the scope of the invention but is merely for the purpose of presenting some concepts of the invention in a simplified form and hereby acts as a preamble of more detailed descriptions which will be presented later.

In view of the above circumstances, an object of the invention is to propose a new frequency measurement solution which uses a low speed MCU together with an external hardware counter to measure the frequency of an input pulse sequence, thereby significantly decreasing the cost while ensuring the same measurement effect as that provided by the FPGA solutions.

According to an aspect of the invention, there is provided a pulse frequency measurement device including: a hardware counter configured to perform a counting operation on an input pulse sequence to output a counting result; and a processing unit configured to obtain number of pulses from the counting result and measure a first time period during which the obtained number of pulses occupy, in which the processing unit includes a frequency calculation module configured to calculate a frequency of the input pulse sequence based on the obtained number of pulses and the first time period.

According to an embodiment of the invention, the frequency calculation module is further configured to calculate the frequency of the input pulse sequence based on the obtained number of pulses and the first time period from the processing unit if the processing unit determines that number of times that the hardware counter reaches its full-scale counting number obtained from the counting result within a predetermined sampling time period is not smaller than a first predetermined threshold or determines that the number of pulses obtained from the counting result within the predetermined sampling time period is not smaller than a second predetermined threshold.

According to an embodiment of the invention, the frequency calculation module is further configured to calculate the frequency of the input pulse sequence based on a time period of a single pulse measured by the processing unit if the processing unit determines that number of times that the hardware counter reaches its full-scale counting number obtained from the counting result within the predetermined sampling time period is smaller than the first predetermined threshold or determines that the number of pulses obtained from the counting result within the predetermined sampling time period is smaller than the second predetermined threshold.

According to another embodiment of the invention, the processing unit further includes a software counter configured to count the number of pulses in the input pulse sequence and measure a second time period during which the counted number of pulses occupy if the processing unit determines that the frequency calculated based on the time period of the single pulse is larger than a predetermined frequency threshold, and the frequency calculation module is further configured to calculate the frequency of the input pulse sequence based on the number of pulses counted by the software counter and the second time period.

According to another embodiment of the invention, the processing unit is further configured to obtain number of pulses that the hardware counter reaches its full-scale counting number from the counting result and obtain the number of pulses based on the number of times and the full-scale counting number, and the first time period is determined based on a point of time at which the hardware counter reaches the full-scale counting number.

According to another embodiment of the invention, a time division strategy is used to measure frequencies of a plurality of input pulse sequences, and the processing unit is further configured to obtain number of pulses of a first input pulse sequence within a first predetermined measuring time period, while to obtain number of pulses of a second input pulse sequence within a second predetermined measuring time period.

According to another embodiment of the invention, if the processing unit determines that less than predetermined number of pulses of the first input pulse sequence are obtained within the first predetermined measuring time period, the first input pulse sequence is measured in background without being limited to the first predetermined measuring time period.

According to another embodiment of the invention, the first and second predetermined measuring time periods are with same length and do not overlap.

According to another embodiment of the invention, the first predetermined threshold is 1, and the second predetermined threshold is the full-scale counting number of the hardware counter.

According to another embodiment of the invention, the time period of the single pulse and the second time period are measured by capturing rising edges of the input pulse sequence.

According to another embodiment of the invention, the processing unit is a micro control unit.

According to another aspect of the invention, there is provided a pulse frequency measurement method including: performing a counting operation on an input pulse sequence to output a counting result by a hardware counter; obtaining number of pulses from the counting result and measuring a first time period during which the obtained number of pulses occupy by a processing unit; and calculating a frequency of the input pulse sequence based on the obtained number of pulses and the first time period by a frequency calculation module in the processing unit if number of times that the hardware counter reaches its full-scale counting number obtained from the counting result within a predetermined sampling time period is not smaller than a first predetermined threshold or the number of pulses obtained from the counting result within the predetermined sampling time period is not smaller than a second predetermined threshold.

According to yet another aspect of the invention, there is provided a control system including the pulse frequency measurement device described above.

According to still another aspect of the invention, there is provided a control system configured to perform the pulse frequency measurement method described above.

According to embodiments of the invention, it is also possible to realize adaptive pulse frequency measurement by automatically recognizing a frequency range of the input pulse sequence without additional user configuration, thereby automatically choosing an optimal frequency measurement manner for different input pulse sequences, and meanwhile to realize a multi-channel sampling for multiple input pulse sequences by adopting a time division strategy.

BRIEF DESCRIPTION OF THE DRAWINGS

The invention can be better understood with reference to the detailed description given below in conjunction with the accompanying drawings, throughout which identical or like reference signs denote identical or like components and together with which the following detailed description is incorporated into and forms a part of the specification and serves to further illustrate the preferred embodiments of the invention and to explain the principle and advantages of the invention. In the drawings.

DETAILED DESCRIPTION OF THE INVENTION

Exemplary embodiments of the present invention will be described below in conjunction with the accompanying drawings. For the sake of clarity and conciseness, not all the features of practical implementations are described in the specification. However, it is to be appreciated that numerous implementation-specific decisions shall be made during developing any of such practical implementations so as to achieve the developer's specific goals, for example, to comply with system- and business-related constraining conditions which will vary from one implementation to another. Moreover, it shall also be appreciated that such a development effort might be very complex and time-consuming but may simply be a routine task for those skilled in the art benefiting from this disclosure.

It shall further be noted that only those device structures and method steps closely relevant to the solutions of the invention are illustrated in the drawings while other details less relevant to the invention are omitted so as not to obscure the invention due to those unnecessary details.

Hereinafter, preferred embodiments of the invention will be described with reference to FIGS. 1 to 5.

First, an example structure of the pulse frequency measurement device will be described with reference to FIG. 1 below.

Figure 1:
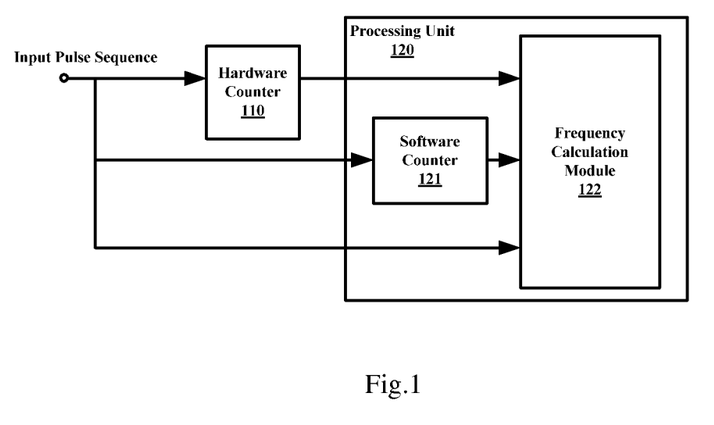
FIG. 1 illustrates a block diagram of an example configuration of a pulse frequency measurement device according to an embodiment of the invention.

As shown in FIG. 1, the pulse frequency measurement device may include a hardware counter 110 and a processing unit 120. It is to be noted that the MCU is used as an example of the processing unit 120 below, but those skilled in the art may use any processing unit having a corresponding function but with a low cost. The processing unit 120 may include a frequency calculation module 122.

The hardware counter 110 may be configured to perform a counting operation on an input pulse sequence to output a counting result. The hardware counter 110 is an electronic device well known to those skilled in the art, and the structure and operating principle thereof will not be described in detail herein. Preferably, noises of the input pulse sequence may have been filtered out before being input into the hardware counter 110. As is known to those skilled in the art, the counting result outputted by the hardware counter 110 may be a carry output signal indicating that the hardware counter 110 has reached its full-scale counting number, or the actual number of pulses counted by the hardware counter 110.

The processing unit 120 may be configured to obtain number of pulses from the counting result outputted by the hardware counter 110 and measure a first time period during which the obtained number of pulses occupy.

The frequency calculation module 122 may be configured to calculate a frequency of the input pulse sequence based on the obtained number of pulses and the first time period.

According to the embodiment of this invention, a processing unit, such as a MCU, with low processing speed is used in order to save cost, but such processing unit may not be able to handle the high frequency pulse sequence. As is known to those skilled in the art, however, the hardware counter may be specially responsible for counting operation and may achieve high performance and high counting accuracy even for a high frequency pulse sequence, which may greatly decrease the MCU's work load, and thus it is possible to measure high frequency pulse sequence using a low speed MCU and with fewer MCU's resources.

Detailed process of the measurement for high frequency pulse sequence using the hardware counter 110 and the processing unit 120 will be described in detail with reference to FIG. 2 below.

Preferably, the processing unit 120 may be further configured to obtain number of times that the hardware counter 110 reaches its full-scale counting number from the counting result and obtain the number of pulses based on the number of times and the full-scale counting number, and the first time period may be determined based on a point of time at which the hardware counter 110 reaches the full-scale counting number.

Specifically, in the embodiment of this invention, in order to simplify the operation and control, it is preferable that the frequency calculation for high frequency pulse sequence is based on the full-scale counting number of the hardware counter 110. By way of example, a preferable interaction process between the hardware counter 110 and the processing unit 120 will be explained briefly first.

When the hardware counter 110 reaches its full-scale counting number, it will output a signal, such as the carry output signal described above, to notify the processing unit 120, which typically will trigger an interrupt event of the processing unit 120 and the processing unit 120 will record the number of times that this signal is received and a corresponding point of time. In this way, there is no need for the processing unit 120 to perform additional operation to retrieve the counted number of pulses, thereby simplifying the operation and further reducing the work load of the processing unit 120. Such notification mechanism is also known as an interrupt mechanism.

In a case that the counting result represents the carry output signal, each time the processing unit 120 receives this signal, it will increase the number of times that the hardware counter 110 reaches the full-scale counting number (simply referred to as number of times hereinafter) by one. On the other hand, if the counting result represents the actual number of pulses, taking a 3-bit counter as an example, the processing unit 120 will increase the number of times by one each time the counting result is 8, while maintaining the current number of times and disregarding the remaining pulses if the counting result is smaller than 8.

As an example, if a point of time at which the hardware counter 110 first reaches its full-scale counting number, that is, a point of time at which the number of times is 1, is recorded as a start time, and a point of time at which the final number of times (referred to as N) is obtained is recorded as an end time, then the total number of pulses is determined by multiplying the number of times N minus 1 with the full-scale counting number which is already known in advance, and the first time period equals to the end time minus the start time.

It shall be appreciated that although the above measurement schemes are implemented preferably based on whether the hardware counter 110 has reached its full-scale counting number so as to further simplify the measurement process, those skilled in the art may readily conceive of configuring the processing unit 120 to initiatively retrieve the counting number from the hardware counter 110 at any appropriate time and record corresponding start time and end time. Then the frequency of the input pulse sequence may be calculated based on the number of pulses measured from the start time to the end time and the time period equaling to the end time minus the start time, and the number of pulses may be obtained partly based on the number of times that the hardware counter reaches its full-scale counting number. However, since the retrieve operation also consumes some time and additional hardware may be needed to support relevant additional operations such as storage and the like, this mechanism may result in error and increase the cost and complexity of circuit design. Thus, the interrupt mechanism based on the carry output of the hardware counter 110 may be more preferable due to high accuracy and low complexity.

Then the frequency calculation module 122 may calculate the frequency of the input pulse sequence based on the number of pulses and the first time period obtained by the processing unit 120. Preferably, in the above first measurement scheme, the frequency calculation manner for high frequency pulse sequence can be expressed in the following equation:

$$\text{frequency} = \text{HardwareCounterValue}/\text{TimePeriod1} \tag{1}$$

in which the HardwareCounterValue equals to a value obtained by multiplying the number of times N minus 1 with the full-scale counting number, and the TimePeriod1 is measured by the processing unit 120 and equals to the end time minus the start time.

Figure 2:
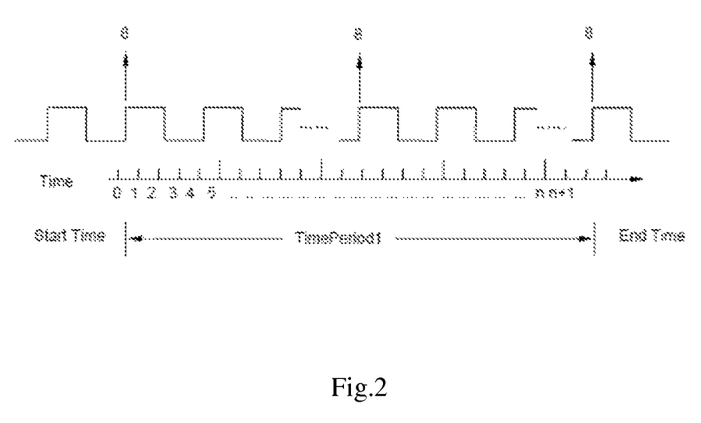
FIG. 2 illustrates an example timing diagram for measurement of a high frequency pulse sequence.

With reference to FIG. 2, assume that the hardware counter 110 is a 3-bit counter which is very cheap, and the full-scale counting number thereof is 8. As shown in FIG. 2, the point of time when the counting number first reaches 8 is recorded as the start time, while the point of time when the counting number reaches 8 for the third time is recorded as the end time, then the HardwareCounterValue equals to $(3-1)*8=16$.

In preferable, the start time may be the point of time at which the hardware counter 110 first reaches its full-scale counting number, and the end time may be the point of time at which the hardware counter 110 reaches its full-scale counting number for the second time, and thus different requirements for frequency measurement can be satisfied by simply choosing number of bits of the hardware counter 110.

As can be seen from above, since the processing unit 120 only needs to perform relevant operations when the hardware counter 110 outputs the carry output signal, its processing capability is sufficient for handling such frequency of operation. In other words, such processing is equivalent to frequency reduction operation, enabling to realize measurement for high frequency pulse sequence even utilizing the processing unit with low processing speed.

For the high frequency pulse sequence, the frequency measurement described above is based on the carry output of the hardware counter 110. However, if the frequency of the input pulse sequence is not high enough, in other words, if the hardware counter 110 can not obtain enough pulses for the subsequent pulse frequency measurement within a predetermined sampling time period, it means that the input pulse sequence may be of a relatively low frequency, and may be not well suitable for being measured with the above measurement scheme, since the processing unit 120 has to wait for a long time to get enough calculation resources so that a real-time user interaction can not be ensured.

Preferably, the frequency calculation module 122 may be further configured to calculate the frequency of the input pulse sequence based on a time period of a single pulse measured by the processing unit 120 if the processing unit 120 determines that number of times that the hardware counter 110 reaches its full-scale counting number obtained from the counting result within a predetermined sampling time period is smaller than a first predetermined threshold or determines that the number of pulses obtained from the counting result within the predetermined sampling time period is smaller than a second predetermined threshold.

Specifically, if the counting result represents the carry output signal, the processing unit 120 may obtain the number of times in an increment of 1 each time the carry output signal is received and obtain the number of pulses based on the number of times and the full-scale counting number of the hardware counter 110. Then, the processing unit 120 may determine whether the number of times obtained within the predetermined sampling time period is smaller than the first predetermined threshold or whether the number of pulses obtained within the predetermined sampling time period is smaller than the second predetermined threshold. Preferably, the first predetermined threshold may be 1, and the second predetermined threshold may be the full-scale counting number of the hardware counter 110. That is to say, if the processing unit 120 receives no carry output signal within the predetermined sampling time period, the input pulse sequence will be regarded as of low frequency.

It shall be appreciated that the first and second predetermined thresholds can of course be set as any appropriate values by those skilled in the art depending on actual requirements.

On the other hand, if the counting result represents the actual number of pulses, the processing unit 120 may obtain the number of pulses by accumulating the counting result and determine whether the number of pulses within the predetermined sampling time period is smaller than the second predetermined time period. If so, then the input pulse sequence will be regarded as of low frequency.

In such case, the frequency calculation module 122 may calculate the frequency of the input pulse sequence based on the time period of the single pulse measured by the processing unit 120.

Figure 3:
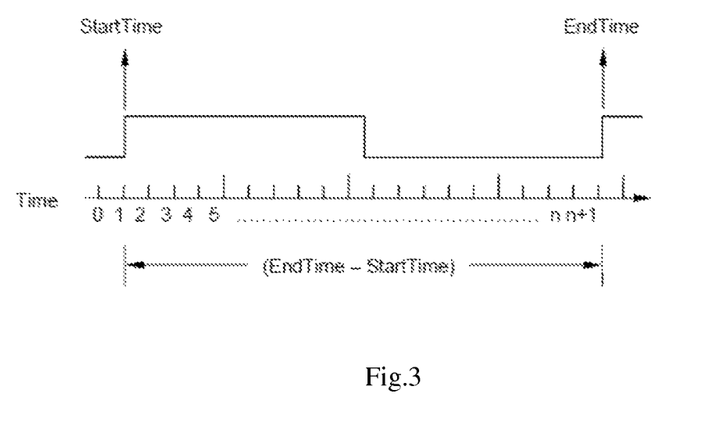
FIG. 3 illustrates an example timing diagram for measurement of a low frequency pulse sequence.

The detailed measurement process for the low frequency pulse sequence is shown in FIG. 3. As can be seen from FIG. 3, the time period of the single pulse is determined by capturing two successive rising edges of the pulse sequence. It is to be noted that this is only an example, and the time period of the single pulse can of course be captured at two successive decreasing edges of the pulse sequence. Preferably, the frequency calculation manner for the low frequency pulse sequence can be expressed in the following equation:

$$\text{frequency}=1/(\text{EndTime}-\text{StartTime}) \qquad (2)$$

in which the EndTime indicates a point of time at which a second rising edge of the input pulse sequence is captured, and the StartTime indicates a point of time at which a first rising edge of the input pulse sequence is captured.

The above measurement manner is particularly suitable for measuring low frequency pulse sequence, since the frequency of the pulse sequence is relatively low so that sampling for the two successive rising edges may be accurate.

However, if the frequency of the pulse sequence is not low enough, then the sampling for only one cycle of the pulse sequence, that is, the time period of the single pulse, may be not accurate, and thus it is required to sample more than one cycle of the pulse sequence and perform an averaging operation so as to eliminate error and improve the accuracy of the measurement.

Preferably, the processing unit 120 may further include a software counter 121. The software counter 121 may be configured to count the number of pulses in the input pulse sequence and measure a second time period during which the counted number of pulses occupy if the processing unit 120 determines that the frequency calculated based on the time period of the single pulse is larger than a predetermined frequency threshold, for example, above 1 kHz. The predetermined frequency threshold may be an empirical value depending on practical use.

In this case, the input pulse sequence is regarded as a medium frequency pulse sequence. Hereinafter, the detailed measuring process for the medium frequency pulse sequence will be described with reference to FIG. 4.

Figure 4:
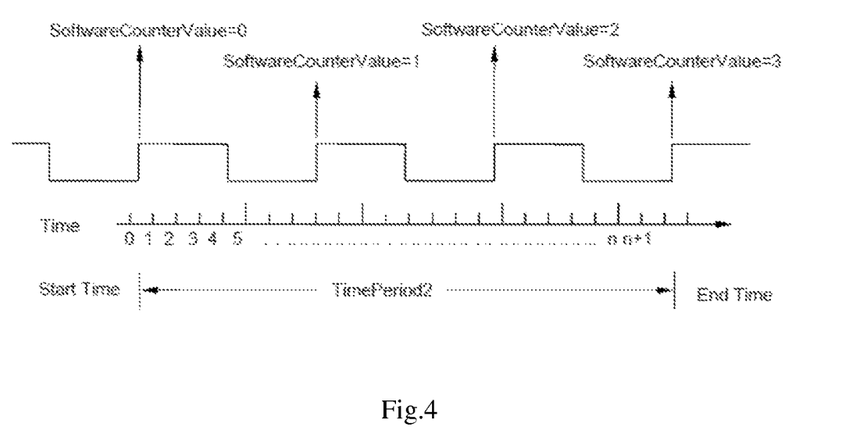
FIG. 4 illustrates an example timing diagram for measurement of a medium frequency pulse sequence.

As can be seen from FIG. 4, when having detected for example the rising edge of the input pulse sequence for the first time, the software counter 121 will record this point of time as a start time. Then, as required, when having detected for example the n-th (where n is an integer larger than 1) rising edge of the input pulse sequence, the software counter 121 will record this point of time as an end time and output the total number of pulses counted thus far, and the second time period equals to the end time minus the start time.

Then the frequency calculation module 122 may be further configured to calculate the frequency of the input pulse sequence based on the number of pulses counted by the software counter 121 and the second time period. Preferably, the frequency calculation manner for medium frequency pulse sequence can be expressed in the following equation:

$$\text{frequency}=\text{SoftwareCounterValue}/\text{TimePeriod2} \qquad (3)$$

in which the SoftwareCounterValue indicates the number of pulses counted by the software counter 121, and the TimePeriod2 equals to the end time minus the start time.

Preferably, both the software counter 121 and the frequency calculation module 122 may be implemented as firmware in the processing unit 120. Moreover, the predetermined sampling time period may be set by the processing unit 120 in advance depending on the performance of the processing unit 120 as well as the actual requirements. Preferably, the predetermined sampling time period as well as various timing functions described above can be implemented by an internal timer of the processing unit 120, thereby ensuring accuracy of measurement result. As an example, the timer may be in an order of microseconds.

As can be seen from above, an adaptive pulse frequency measurement is achieved according to the embodiment of the invention. Specifically, the external input pulse sequence will be first input into the hardware counter 110, then the processing unit 120 will do a fast trial sampling to estimate a rough frequency range of the pulse sequence and then chooses an optimal measurement scheme for pulse sequences with different frequencies based on the estimated frequency range. Therefore, there is no need for the user to estimate and specify an input pulse frequency range as a configuration item, thereby achieving intelligence and automation for frequency measurement in the process automation industry. Meanwhile, different optimal frequency measurement strategies are used for different pulse sequences so that high measurement accuracy is ensured.

Furthermore, to support multi-channel sampling for a plurality of input pulse sequences, a time division strategy may be adopted, that is to say, frequency measurement for each input pulse sequence will occupy a time slice.

Specifically, the processing unit 120 may be further configured to obtain number of pulses of a first input pulse sequence within a first predetermined measuring time period, while to obtain number of pulses of a second input pulse sequence within a second predetermined measuring time period. Thus, the first and second predetermined measuring time periods may be so-called time slices assigned to each of the plurality of input pulse sequences. Preferably, the first and second predetermined measuring time periods are with same length and do not overlap.

It shall be appreciated that the time slice is a time mechanism for controlling switching among frequency measurements for the plurality of input pulse sequences, and may be set according to actual requirements, such as a data updating frequency required for an end user, and so on. In preferable, the time slice can also be implemented by the internal timer in the processing unit 120.

Preferably, if the processing unit 120 determines that less than predetermined number of pulses of the first input pulse sequence are obtained within the first predetermined measuring time period, the first input pulse sequences will be measured in background without being limited to the first predetermined measuring time period.

As an example, if even one pulse of an input pulse sequence can not be obtained within the whole time slice assigned to the pulse sequence, that is, the frequency of the pulse sequence can not be measured within the time slice, it means that this pulse sequence has a very low frequency and it is safe to put frequency measurement thereof at background in parallel with other pulse sequence measurement time slices, so that the measurement process for very low frequency pulse sequence will not block others.

Although specific implementations of the pulse frequency measurement device according to the preferred embodiments of the invention have been described above with reference to FIGS. 1-4, it is to be understood that the structure as shown in FIG. 1 and electronic components used therein are only exemplary without limitation, and those skilled in the art may make various variations and alternations to the above structure according to the principles taught by the invention as required.

Next, an example flow of a pulse frequency measurement method according to an embodiment of the invention will be described with reference to FIG. 5.

Figure 5:
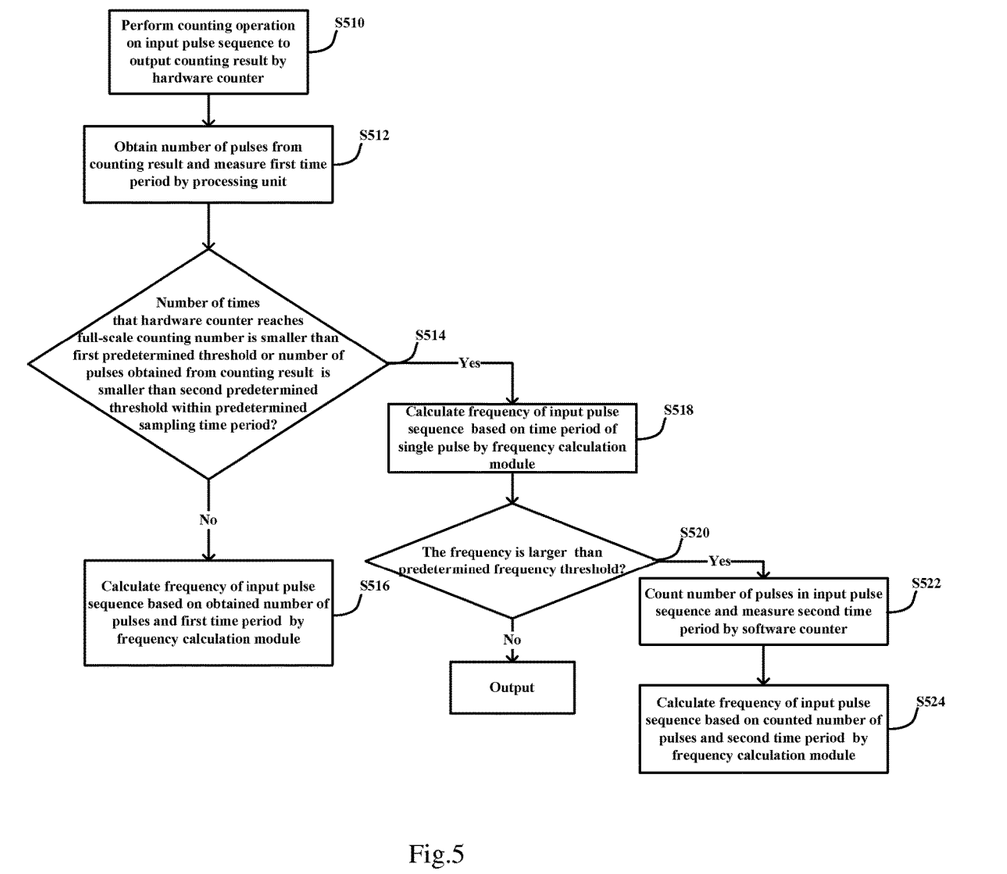
FIG. 5 illustrates an example flow chart of a pulse frequency measurement method according to an embodiment of the invention.

It is to be noted that the flow as shown in FIG. 5 is only a specific exemplary implementation of the pulse frequency measurement method according to the embodiment of the invention, which facilitates understanding on the invention as a whole, but the implementations will not be limited to this.

As shown in FIG. 5, first, in step S510, a pulse sequence is input into the hardware counter 110 and a counting operation is performed on the input pulse sequence to output a counting result by the hardware counter 110.

Next, in step S512, number of pulses is obtained from the counting result and a first time period during which the obtained number of pulses occupy is measured by the processing unit 120.

Preferably, the number of pulses may be obtained by the processing unit 120 based on number of times that the hardware counter 110 reaches its full-scale counting number and the full-scale counting number, the number of times being obtained by the processing unit 120 from the counting result. Further, the first time period may be determined based on a point of time at which the hardware counter 110 reaches the full-scale counting number. The detailed description about implementation of process in step 512 can be referred to the above corresponding description with respect to the pulse frequency measurement device, and no repeated description will be made herein.

Then in step S514, it is determined whether the number of times that the hardware counter 110 reaches its full-scale counting number obtained from the counting result within a predetermined sampling time period is smaller than a first predetermined threshold or determines that the number of pulses obtained from the counting result within the predetermined sampling time period is smaller than a second predetermined threshold. Preferably, the first predetermined threshold may be 1, and the second predetermined threshold may be a full-scale counting number of the hardware counter 110.

If not, then it means that the input pulse sequence is a high frequency pulse sequence, and in step S516, a frequency of the input pulse sequence is calculated by the frequency calculation module 122 based on the number of pulses and the first time period obtained by the processing unit 120 in step S512. The detailed description about frequency measurement for high frequency pulse sequence can be referred to the above corresponding description with respect to the pulse frequency measurement device.

On the other hand, if the determination result in step S514 is YES, then it means that this pulse sequence may not be well suitable for being measured using the hardware counter 110, and in step S518, the frequency of the input pulse sequence is calculated by the frequency calculation module 122 based on a time period of a single pulse measured by the processing unit 120.

Next, in step S520, it is determined whether the frequency calculated based on the time period of the single pulse in step 518 is larger than a predetermined frequency threshold.

If not, it means that the frequency of the input pulse sequence is relatively low, for example, below 1 kHz, and only one cycle sampling is sufficient for calculating the frequency of the pulse sequence, then the calculation result in step S518 is output.

On the other hand, if it is determined in step S520 that the frequency calculated in step 518 is larger than the predetermined frequency threshold, it means that the input pulse sequence may be of medium frequency, and only one cycle sampling can not ensure the measurement accuracy, and then in step S522, the number of pulses in the input pulse sequence is counted and a second time period during which the counted number of pulses occupy is measured by the software counter 121.

Next, in step S524, the frequency of the input pulse sequence is calculated by the frequency calculation module 122 based on the number of pulses and the second time period obtained by the software counter 121 in step S522.

According to the above description of the example flow of the pulse frequency measurement method, an adaptive pulse frequency measurement can be implemented. Specifically, different optimal measurement schemes for input pulse sequences with different frequencies may be chosen automatically by the processing unit 120 without user's configuration, thereby realizing automation and intelligence in frequency measurement.

In addition, in order to achieve multi-channel sampling for multiple input pulse sequences, a time division strategy may be used in the above pulse frequency measurement method. More specifically, a time slice can be assigned to each channel/each few channels, only one channel or few channels are measured at a point of time, and another channel or another few channels are measured at another point of time. To further lower the calculation capacity of the processing unit, the time slice for each channel/each few channels does not overlap so that only one/few channels are measured at one time. Preferably, the time slice for each channel/few channels is at same length.

Preferably, if less than predetermined number of pulses of a certain pulse sequence are obtained by the processing unit 120 within a measurement time slice assigned to the pulse sequence, that is, the frequency measurement of the pulse sequence can not be realized or can not satisfy the measurement requirements with the time slice, then it is safe to put frequency measurement thereof at background in parallel with measurements of other pulse sequences, without being limited to the time slice assigned thereto. Less than predetermined number of pulses means that the pulse sequence is at a relatively low frequency and thus the calculation capacity requirement of the processing unit is relatively low. By putting its measurement at background, its frequency can be measured as required and no extra cost is incurred. The detailed description about the time division strategy can be referred to the corresponding description of the pulse frequency measurement device, and no repeated description will be made herein.

It shall be understood that the above flow is only an example implementation for the pulse frequency measurement, and some steps may be omitted or some additional steps may be added as required. For example, the steps relevant to the middle and low frequency pulses may be optional, which may achieve better measurement effect.

Further, it shall be appreciated that the pulse frequency measurement method corresponds to the forgoing pulse frequency measurement device, the details which are not described in the method can be found in the corresponding description with respect to the frequency measurement device and no repeated description will be made herein.

Further, any control system that utilizes the above-described pulse frequency measurement device or method will also fall within the protection scope of the invention.

It shall also be noted that obviously each component or each step may be decomposed and/or recombined in the device and method of the present invention. These decompositions and/or re-combinations shall be considered as equivalent schemes of the present invention. Also, the steps of performing the above series of processes may be naturally performed chronologically in an order of description but not necessarily. Some steps may be performed in parallel or independently from one another.

Although the invention and advantages thereof have been described in detail herein, it shall be understood that various changes, replacements and modifications may be made by one skilled in the art without departing from the spirit and scope of the invention defined by the appended claims. Furthermore, the terms "comprise", "include" or any other variation thereof are intended to cover a non-exclusive inclusion, so that a process, method, article, or device that comprises a list of elements includes not only those elements but also other elements not explicitly listed or inherent to such process, method, article, or device. Unless further defined, a sentence "comprises a/an . . . " which defines an element does not preclude the existence of additional identical element(s) in the process, method, article, or device that comprises the element.

The invention claimed is:

1. A pulse frequency measurement device comprising:
a hardware counter that performs a counting operation on an input pulse sequence to output a counting result; and
a processing unit that obtains a number of pulses from the counting result and measures a first time period occupied by the obtained number of pulses, wherein the processing unit further comprises a frequency calculation module that calculates a frequency of the input pulse sequence based on the obtained number of pulses and the first time period,
wherein the frequency calculation module further calculates the frequency of the input pulse sequence based on a time period of a single pulse measured by the processing unit if the processing unit:
determines that number of times that the hardware counter reaches a full-scale counting number obtained from the counting result within a predetermined sampling time period is smaller than a first predetermined threshold; or
determines that the number of pulses obtained from the counting result within the predetermined sampling time period is smaller than a second predetermined threshold.

2. The pulse frequency measurement device according to claim 1, wherein the processing unit further comprises a software counter that counts the number of pulses in the input pulse sequence and measures a second time period occupied by the counted number of pulses if the processing unit determines that the frequency calculated based on the time period of the single pulse is larger than a predetermined frequency threshold, wherein the frequency calculation module further calculates the frequency of the input pulse sequence based on the number of pulses counted by the software counter and the second time period.

3. The pulse frequency measurement device according to claim 2, wherein the predetermined frequency threshold is 1 kHz.

4. The pulse frequency measurement device according to claim 2, wherein the time period of the single pulse and the second time period are measured by capturing rising edges of the input pulse sequence.

5. The pulse frequency measurement device according to claim 4, wherein the processing unit is a micro control unit.

6. The pulse frequency measurement device according to claim 1, wherein the processing unit obtains a number of times that the hardware counter reaches its full-scale counting number from the counting result and obtains the number of pulses based on the number of times and the full-scale counting number, wherein the first time period is determined based on a point of time at which the hardware counter reaches the full-scale counting number.

7. The pulse frequency measurement device according to claim 1, wherein a time division strategy is used to measure frequencies of a plurality of input pulse sequences, and the processing unit further obtains the number of pulses of a first input pulse sequence within a first predetermined measuring time period, while obtaining a number of pulses of a second input pulse sequence within a second predetermined measuring time period.

8. The pulse frequency measurement device according to claim 7, wherein if the processing unit determines that less than predetermined number of pulses of the first input pulse sequence are obtained within the first predetermined measuring time period, the first input pulse sequence is measured in a background without being limited to the first predetermined measuring time period.

9. The pulse frequency measurement device according to claim 7, wherein the first predetermined measuring time period and the second predetermined measuring time periods are equal in length and do not overlap.

10. The pulse frequency measurement device according to claim 1, wherein the first predetermined threshold is equal to a value of 1, and the second predetermined threshold is the full-scale counting number of the hardware counter.

11. The pulse frequency measurement method according to claim 1, wherein a time division strategy is used to measure frequencies of a plurality of input pulse sequences, and a number of pulses of a first input pulse sequence is obtained by the processing unit within a first predetermined measuring time period, while a number of pulses of a second input pulse sequence is obtained by the processing unit within a second predetermined measuring time period.

12. The pulse frequency measurement method according to claim 11, wherein if less than predetermined number of pulses of the first input pulse sequence are obtained within the first predetermined measuring time period, the first input pulse sequence is measured in a background without being limited to the first predetermined measuring time period.

13. The pulse frequency measurement method according to claim 11, wherein the first predetermined measuring time period and the second predetermined measuring time periods are a same length and do not overlap.

14. A control system comprising the pulse frequency measurement device according to claim 1.

15. A pulse frequency measurement method comprising:
performing a counting operation on an input pulse sequence to output a counting result by a hardware counter;
obtaining number of pulses from the counting result and measuring, by a processing unit, a first time period occupied by the obtained number of pulses; and
calculating a frequency of the input pulse sequence based on the obtained number of pulses and the first time period by a frequency calculation module in the processing unit if number of times that the hardware counter reaches its full-scale counting number obtained from the counting result within a predetermined sampling time period is not less than a first predetermined threshold or the number of pulses obtained from the counting result within the predetermined sampling time period is not smaller than a second predetermined threshold; and
calculating the frequency of the input pulse sequence based on a time period of a single pulse measured by the processing unit if the number of times that the hardware counter reaches its full-scale counting number obtained from the counting result within the predetermined sampling time period is smaller than the first predetermined threshold or the number of pulses obtained from the counting result within the predetermined sampling time period is smaller than the second predetermined threshold.

16. The pulse frequency measurement method according to claim 15, further comprising:
counting the number of pulses in the input pulse sequence and measuring a second time period during which the counted number of pulses occupy by a software counter in the processing unit if the frequency calculated based on the time period of the single pulse is larger than a predetermined frequency threshold; and
calculating the frequency of the input pulse sequence based on the number of pulses counted by the software counter and the second time period by the frequency calculation module.

17. The pulse frequency measurement method according to claim 16, wherein the time period of the single pulse and the second time period are measured by capturing rising edges of the input pulse sequence.

18. The pulse frequency measurement method according to claim 16, wherein the predetermined frequency threshold is 1 kHz.

19. The pulse frequency measurement method according to claim 15, wherein the number of times that the hardware counter reaches its full-scale counting number is obtained from the counting result and the number of pulses is obtained based on the number of times and the full-scale counting number by the processing unit, and wherein the first time period is determined based on a point of time at which the hardware counter reaches the full-scale counting number.

20. The pulse frequency measurement method according to claim 15, wherein the first predetermined threshold is equal to a value of 1, and the second predetermined threshold is the full-scale counting number of the hardware counter.

21. The pulse frequency measurement method according to claim 15, wherein the processing unit is a micro control unit.

22. A control system configured to perform the pulse frequency measurement method according to claim 15.

* * * * *